United States Patent
Kim

(10) Patent No.: US 9,972,645 B2
(45) Date of Patent: May 15, 2018

(54) FLEXIBLE DISPLAY DEVICE

(71) Applicant: LG Display Co., Ltd., Seoul (KR)

(72) Inventor: Sangwoo Kim, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/219,494

(22) Filed: Jul. 26, 2016

(65) Prior Publication Data
US 2017/0194354 A1  Jul. 6, 2017

(30) Foreign Application Priority Data
Dec. 31, 2015 (KR) .......................... 10-2015-0191806

(51) Int. Cl.
| | |
|---|---|
| H01L 27/12 | (2006.01) |
| G09G 3/32 | (2016.01) |
| G09G 3/20 | (2006.01) |
| G09G 3/3233 | (2016.01) |

(52) U.S. Cl.
CPC ......... *H01L 27/124* (2013.01); *G09G 3/2092* (2013.01); *G09G 3/3233* (2013.01); *G09G 2300/0861* (2013.01); *G09G 2310/0262* (2013.01); *G09G 2380/02* (2013.01)

(58) Field of Classification Search
CPC ... H01L 27/124; H01L 27/32; H01L 2227/32; H01L 2224/25175; G09G 3/2092; G09G 3/3233; G09G 2380/02; G09G 2300/0861; G09G 2310/0262; G09G 2370/045
See application file for complete search history.

(56) References Cited

U.S. PATENT DOCUMENTS

| | | | |
|---|---|---|---|
| 6,191,832 B1 * | 2/2001 | Nakakura ......... | G02F 1/136286 349/52 |
| 2012/0105755 A1 * | 5/2012 | Zen ..................... | G02F 1/13452 349/42 |
| 2016/0379998 A1 * | 12/2016 | Choi .................. | H01L 27/1244 257/72 |

* cited by examiner

*Primary Examiner* — Galina Yushina
(74) *Attorney, Agent, or Firm* — Morgan, Lewis & Bockius LLP

(57) ABSTRACT

A flexible display device including a substrate having an active region in which an input image is implemented and a bezel region outside the active region; a signal line (or an electrode) extending from the bezel region and transmitting a signal (or a voltage) to the active region; and a first bypass line provided above or below the signal line with one or more insulating layers interposed therebetween in the bezel region, wherein the first bypass line is connected to the signal line via a first bypass contact hole penetrating through the one or more insulating layers and receives the same signal as that of the signal line, and wherein the first bypass contact hole is provided as at least two bypass contact holes.

7 Claims, 16 Drawing Sheets

(a) <Inner Curved>

(b) <Outer Curved>

FLEXIBLE DISPLAY DEVICE

This application claims the priority benefit of Korean Patent Application No. 10-2015-0191806 filed on Dec. 31, 2015 which is incorporated herein by reference for all purposes as if fully set forth herein.

BACKGROUND

Field

The present disclosure relates to a display device, and more particularly, to a flexible display device.

Description of Related Art

Various flat display devices reduced in weight and volume, compared with cathode ray tubes (CRTs) heavy in weight and large in volume, have been developed. Flat display devices include a liquid crystal display (LCD), a field emission display (FED), a plasma display panel (PDP), an organic light emitting display device, and the like.

Display devices, which are thin and lightweight, are commonly used as display units in mobile communication terminals or portable information processing devices. In particular, portable or mobile devices increasingly require display panels that are thinner and lighter and consume less power. Such display devices have been applied to various fields such as TVs, automobile displays, wearable devices, and the like, as well as mobile devices such as smartphones and table PCs. In order to be applied to various fields, display devices are required to be structurally deformed in various manners.

To meet the requirements, recently, flexible display devices that can be bent or folded have been actively developed. For example, flexible display devices may implement an input image on an active region of a display panel including a plastic organic light emitting diode (OLED). The plastic OLED may be formed on a bendable (flexible, pliable, or bowable) plastic substrate. Since flexible display devices are available for variously designs as requested, structural restrictions that may be caused in using related art display devices may be significantly reduced.

FIGS. 1 and 2 are views illustrating an example of a flexible display device. A flexible display device may be bent in a forward direction of a display device (inner curved), as shown in part (a) of FIG. 1, or in a backward direction of a display device (outer curved), as shown in part (b) of FIG. 1. When the flexible display device is bent, stress is applied on the display device.

When stress equal to or greater than breaking strength is applied to the flexible display device 1, signal lines 3 formed within the display device 1 may be cracked or disconnected. Cracks generated in the signal lines 3 may cause defective screen driving of the flexible display device 1, degrading product reliability and stability. In order to enhance reliability and stability of the flexible display device 1, a structural solution allowing the display device 1 to be stably bent is required.

SUMMARY

Accordingly, the present invention is directed to a flexible display device that substantially obviates one or more of the problems due to limitations and disadvantages of the related art.

An object of the present disclosure is to provide a flexible display device in which a plurality of signal transmission paths to which the same signal is applied are provided in a bezel region to thereby minimize defective driving when a signal transmission path is blocked.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a flexible display device includes a substrate having an active region in which an input image is implemented and a bezel region outside the active region; a signal line (or an electrode) extending from the bezel region and transmitting a signal (or a voltage) to the active region; and a first bypass line provided above or below the signal line with one or more insulating layers interposed therebetween in the bezel region, wherein the first bypass line is connected to the signal line via a first bypass contact hole penetrating through the one or more insulating layers and receives the same signal as that of the signal line, and wherein the first bypass contact hole is provided as at least two bypass contact holes.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various embodiments, the same components will be representatively described in a first embodiment and may be omitted in other embodiments.

It will be understood that, although the terms first, second, etc. may be used herein to describe various elements, these elements should not be limited by these terms. These terms are only used to distinguish one element from another.

It is to be understood that when one element is referred to as being "connected to" or "coupled to" another element, it may be connected directly to or coupled directly to another element or be connected to or coupled to another element, having the other element intervening therebetween. On the other hand, it is to be understood that when one element is referred to as being "connected directly to" or "coupled directly to" another element, it may be connected to or coupled to another element without the other element intervening therebetween.

A display device according to an embodiment of the present disclosure may be realized on the basis of a liquid crystal display (LCD), a field emission display (FED), a plasma display panel (PDP), an organic light emitting display device, an electrophoretic display (EFD), a quantum dot display (QDD), and the like. Hereinafter, for the purposes of description, a case in which a flexible display device includes an organic light emitting diode (OLED) element will be described as an example.

Figure 1:
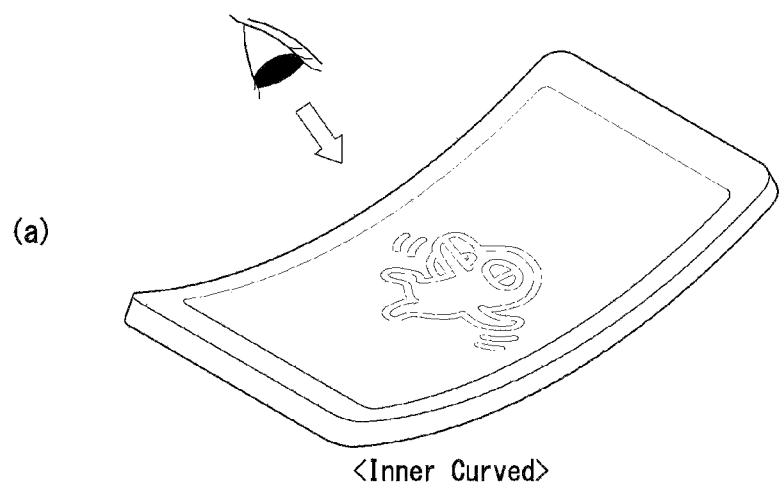
FIGS. 1 and 2 are views illustrating an example of a flexible display device.
Figure 1:
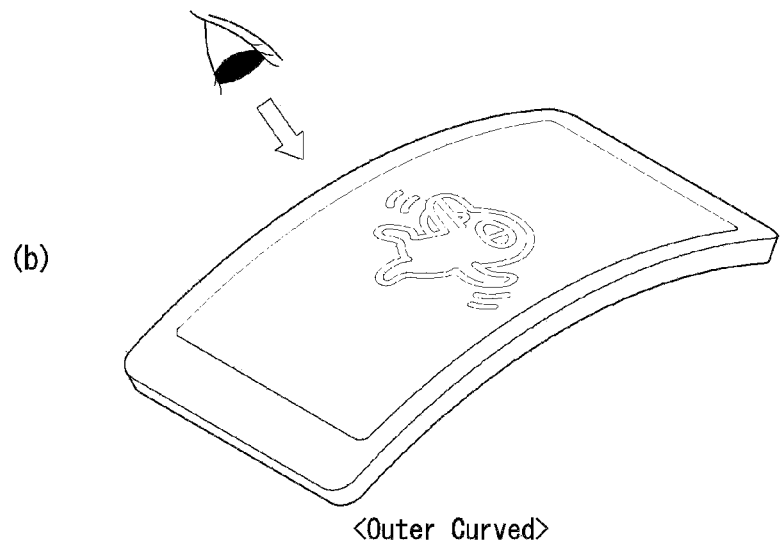
Figure 2:
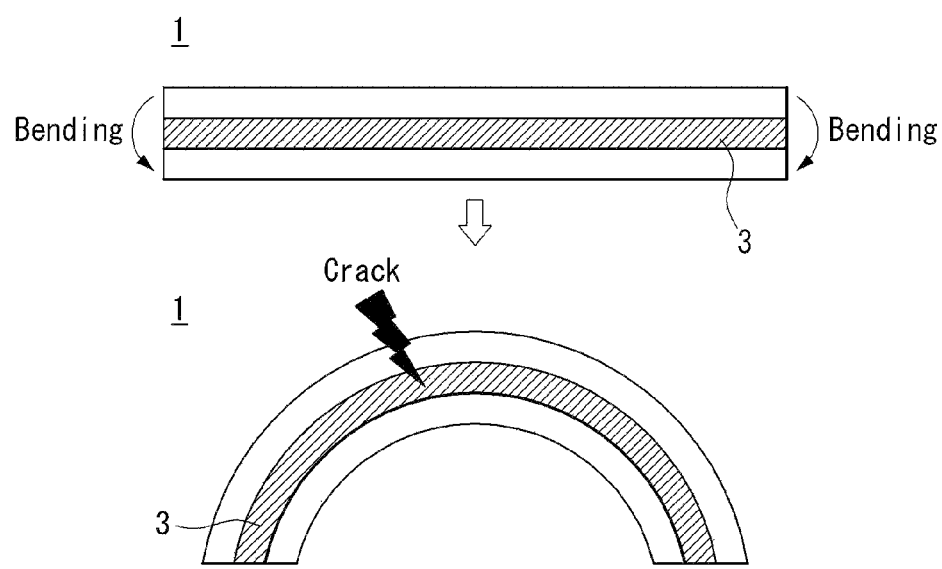
Figure 3:
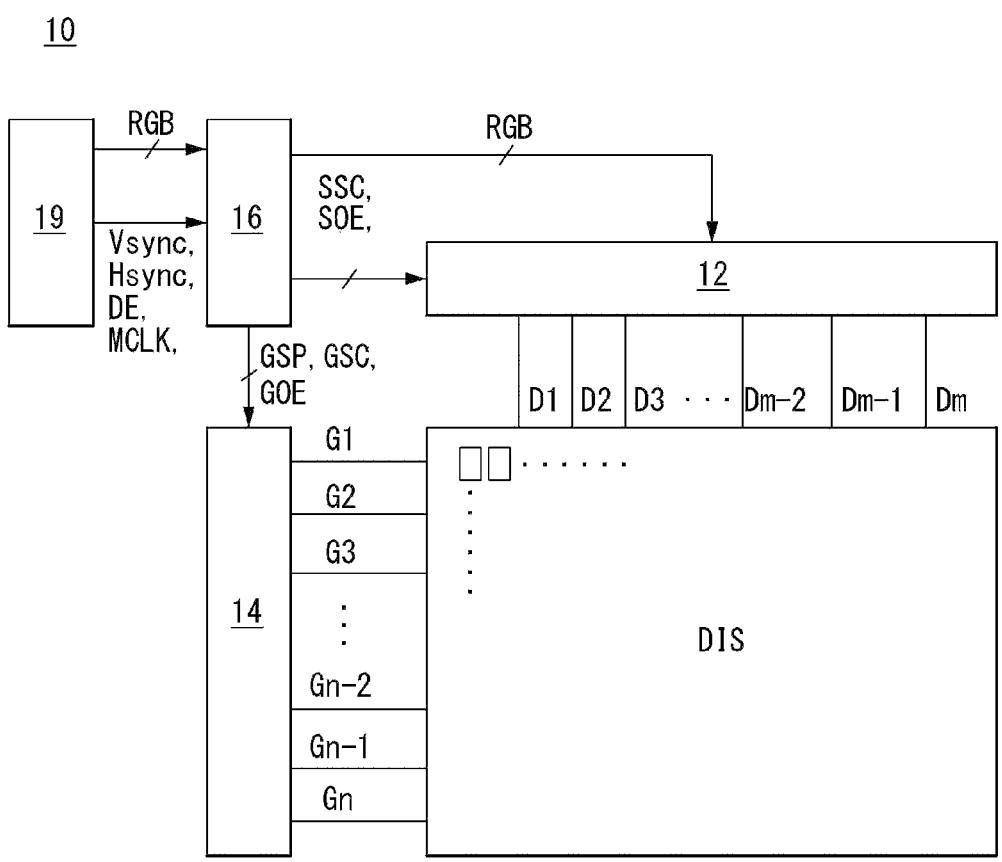
FIG. 3 is a view schematically illustrating a flexible display device according to an embodiment of the present disclosure.
Figure 4:
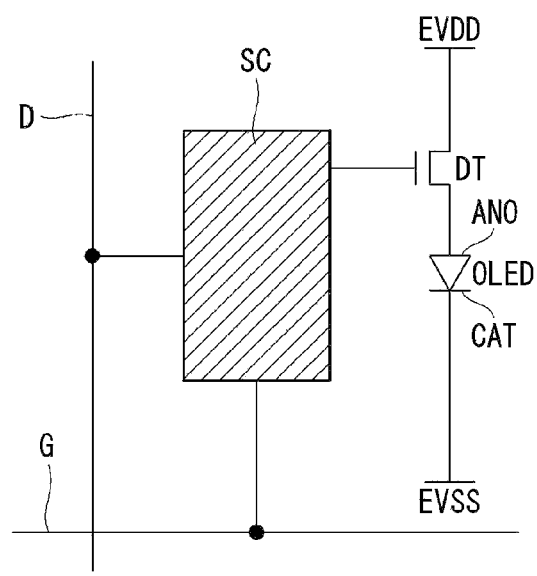
FIG. 4 is a view schematically illustrating a configuration of a pixel illustrated in FIG. 3.
Figure 5:
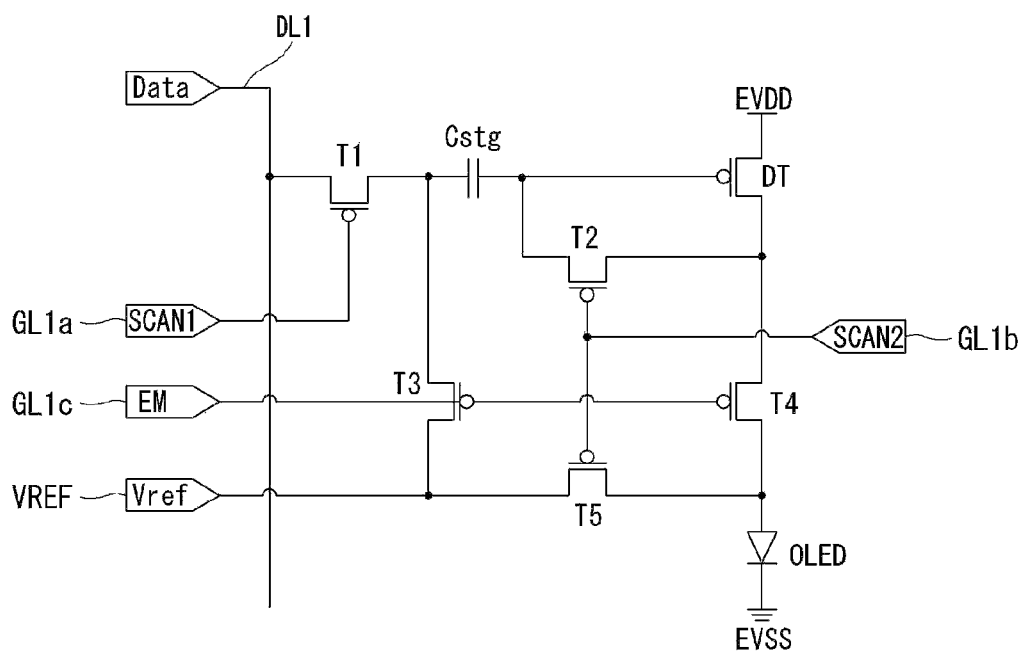
FIG. 5 is a view illustrating an example of a configuration of a circuit within a pixel illustrated in FIG. 3.

FIG. 3 is a view schematically illustrating a flexible display device according to an embodiment of the present disclosure. FIG. 4 is a view schematically illustrating a configuration of a pixel illustrated in FIG. 3. FIG. 5 is a view illustrating an example of a configuration of a circuit within a pixel illustrated in FIG. 3.

Referring to FIG. 3, a flexible display device 10 according to an embodiment of the present disclosure includes a display driving circuit and a display panel DIS.

The display driving circuit includes a data driving circuit 12, a gate driving circuit 14, and a timing controller 16 and writes a video data voltage of an input image into pixels of the display panel DIS. The data driving circuit 12 converts digital video data RGB input from the timing controller 16 into an analog gamma compensation voltage to generate a data voltage. The data voltage output from the data driving circuit 12 is supplied to data lines D1 to Dm. The gate driving circuit 14 sequentially supplies a gate signal in synchronization with a data voltage to the gate lines G1 to Gn to select pixels of the display panel DIS to which the data voltage is written Upon receiving timing signals such as a vertical synchronization signal Vsync, a horizontal synchronization signal Hsync, a data enable signal DE, a main clock MLCK, and the like, input from a host system 19, the timing controller 16 synchronizes operation timing of the data driving circuit 12 and the gate driving circuit 14. Data timing control signals for controlling the data driving circuit 12 include a source sampling clock (SSC), a source output enable (SOE) signal, and the like. Gate timing control signals for controlling the gate driving circuit 14 include a gate start pulse (GSP), a gate shift clock (GSC), a gate output enable (GOE) signal, and the like.

The host system 19 may be realized as any one of a television system, a set-top box (STB), a navigation system, a DVD player, a Blu-ray player, a personal computer (PC), a home theater system, and a phone system. The host system 19 includes a system on chip (SoC) equipped with a scaler and converts digital video data RGB of an input image into a format appropriate to be displayed on the display panel DIS. The host system 19 transmits the timing signals Vsync, Hsync, DE, and MCLK together with the digital video data RGB to the timing controller 16.

A pixel array of the display panel DIS includes pixels formed in a pixel region defined by the data lines D1 to Dm (m is a positive integer) and gate lines G1 to Gn (n is a positive integer). The pixels each include an OLED, a self-luminous element.

Referring further to FIG. 4, a plurality of data lines D and a plurality of gate lines G are intersect with each other on the display panel DIS, and pixels are disposed in a matrix form in each intersection. The pixels each includes an OLED, a driving thin film transistor TFT DT controlling an amount of current flowing in the OLED, and a programming unit SC for setting a voltage between a gate and a source of the driving TFT DT.

The programming unit SC may include at least one switch TFT and at least one storage capacitor. The switch TFT may be turned on in response to a gate signal from the gate line G to thereby apply a data voltage from the data line D to one side of the storage capacitor. The driving TFT DT adjusts an amount of lighting of the OLED by controlling a current amount supplied to the OLED according to a magnitude of a voltage charged in the storage capacitor. An amount of lighting of the OLED is proportional to an amount of current supplied from the driving TFT DT. The pixels are connected to a high potential voltage source EVDD and a low potential voltage source EVSS and receive a high potential power voltage and a low potential source voltage from a power generating unit (not shown). The TFTs forming a pixel may be realized as p type TFTs or n type TFTs. Also, a semiconductor layer of the TFTs forming pixels may include amorphous silicon, polysilicon, or an oxide. The OLED includes an anode electrode ANO, a cathode electrode CAT, and an organic compound layer interposed between the anode electrode ANO and the cathode electrode CAT. The anode electrode ANO is connected to the driving TFT DT.

Referring to FIG. 5, the pixel may be configured to have a 6T (transistor) 1C (capacitor) structure. However, the pixel configuration of the present disclosure is not limited thereto. That is, the present disclosure may include any OLED pixel structure using a scheme of adjusting a current flowing in the OLED by using the driving TFT.

Hereinafter, a case in which the TFT included in the pixel is a p-type TFT will be described as an example, but the present disclosure is not limited thereto and the TFT may be an n-type TFT. In the TFT, positions of a source electrode and a drain electrode may be different according to types, and thus, hereinafter, the source electrode and the drain electrode will be termed a first electrode and a second electrode, respectively.

A first TFT T1 includes a gate electrode connected to an 1a-th gate line GL1a, a first electrode connected to a first data line DL1, and a second electrode connected to zone end of a storage capacitor Cstg. In response to a 1a-th gate signal SCAN1, the first TFT T1 serves to transmit a data voltage supplied through the first data line DL1 to the capacitor Cstg.

A second TFT T2 includes a gate electrode connected to a 1b-th gate line GL1b, a first electrode connected to a gate electrode of the driving TFT DT, and a second electrode connected to a second electrode of the driving TFT DT. In response to a 1b-th gate signal SCAN2, the second TFT T2 serves to make a node of the gate electrode and the source electrode of the driving TFT DT to a diode connection state.

A third TFT T3 includes a gate electrode connected to a 1c-th gate line GL1c, a first electrode connected to a reference voltage line VREF, and a second electrode connected to one end of the storage capacitor Cstg. In response to a 1c-th gate signal EM, the third TFT T3 serves to supply a reference voltage Vref (or a compensation voltage) to one end of the storage capacitor Cstg.

A fourth TFT T4 includes a gate electrode connected to the 1c-th gate line GL1c, a first electrode connected to a second electrode of the driving TFT DT, and a second electrode connected to an anode electrode of the OLED. In response to the 1b-th gate signal SCAN2, the fourth TFT T4 serves to transmit a driving current to the OLED and cause the OLED to emit light.

A fifth TFT T5 includes a gate electrode connected to the 1b-th gate line GL1b, a first electrode connected to the reference voltage line VREF, and a second electrode connected to an anode electrode of the OLED. In response to the 1b-th gate signal SCAN2, the fifth TFT T5 serves to supply the reference voltage Vref to the anode electrode of the OLED.

The driving TFT DT includes a gate electrode connected to the other end of the storage capacitor Cstg, a first power source (or the high potential voltage source) EVDD, and a second electrode connected to the first electrode of the fourth TFT T4. In response to a data voltage supplied from the storage capacitor Cstg, the driving TFT DT is turned on and generates a driving current to be supplied to the OLED.

The OLED includes an anode electrode connected to the second electrode of the fourth TFT T4 and a cathode electrode connected to the second power source (or the low potential voltage source) EVSS. The GELD emits light in response to a driving current transmitted through the fourth TFT T4.

Figure 6:
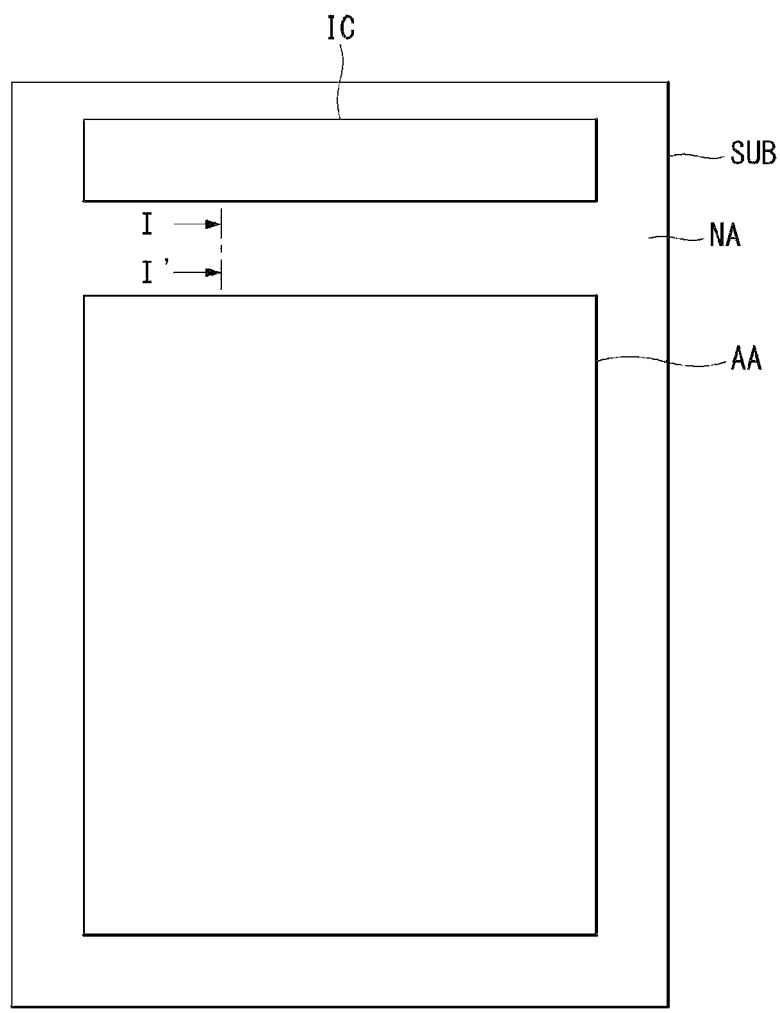
FIG. 6 is a plan view illustrating a schematic structure of a flexible display device according to an embodiment of the present disclosure.
Figure 7:
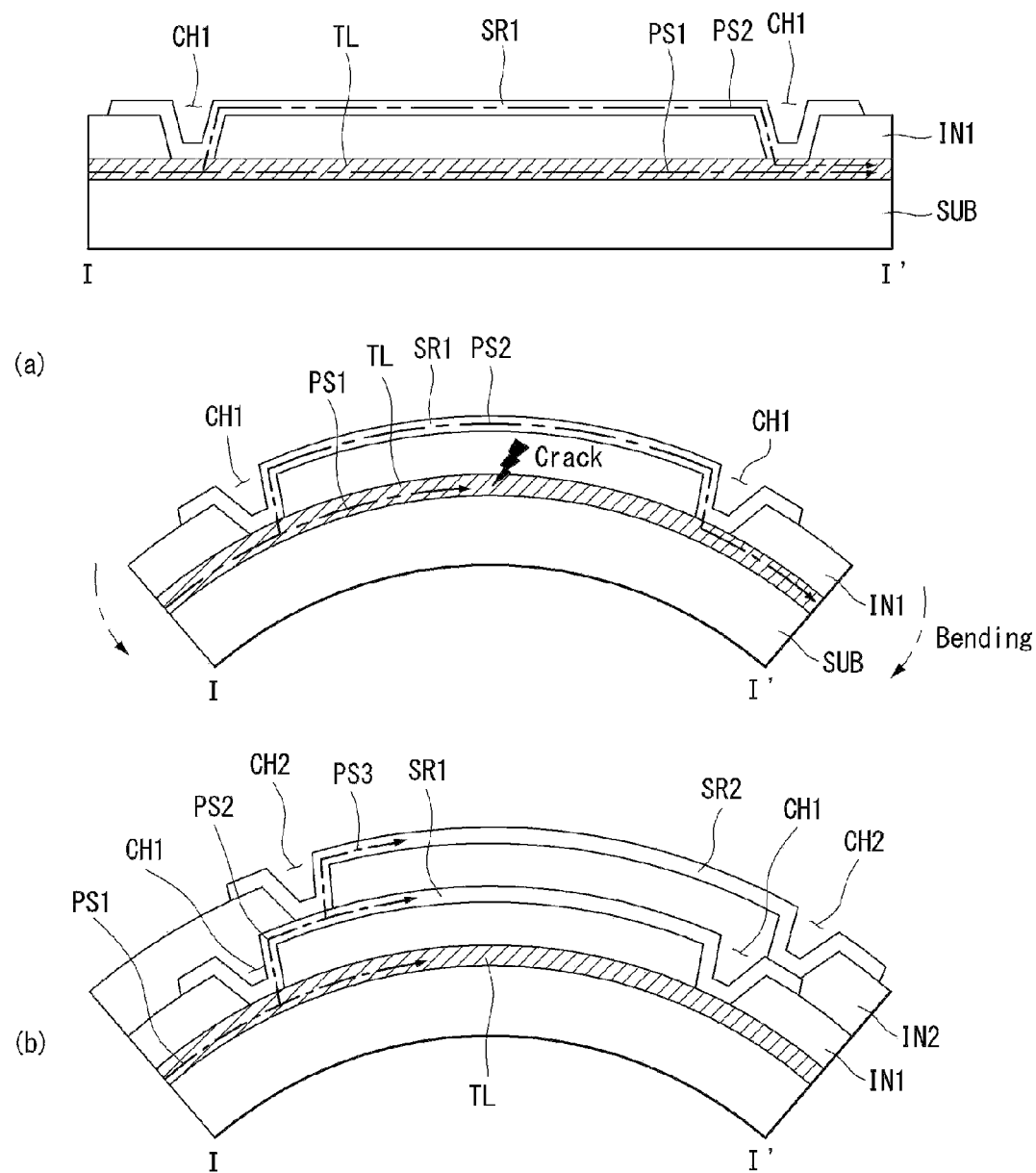
FIGS. 7 and 8 are cross-sectional views taken along line I-I of FIG. 6.
Figure 8:
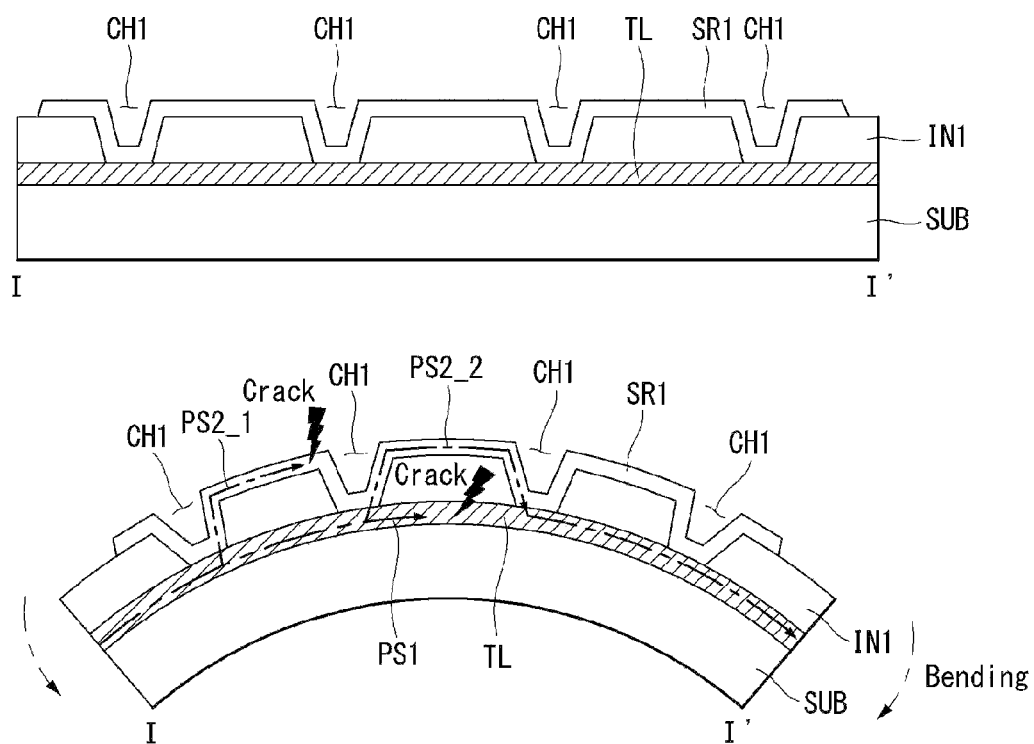

Hereinafter, features of the flexible display device according to the present disclosure will be described with reference to FIGS. 6 through 8. FIG. 6 is a plan view illustrating a schematic structure of a flexible display device according to an embodiment of the present disclosure. FIGS. 7 and 8 are cross-sectional views taken along line I-I of FIG. 6.

Referring to FIG. 6, the flexible display device according to the present disclosure includes a substrate SUB divided into an active region AA in which an input image is implemented and a bezel region NA in which various elements for driving the active region AA are disposed.

The substrate SUB may be formed of glass or plastic having flexible characteristics. For example, the substrate SUB may be formed of a material such as polyimide (PI), polyethylene terephthalate (PET), polyethylene naphthalate (PEN), polycarbonate (PC), polyethersulfone (PES), polyarylate (PAR), polysulfone (PSF), ciclic-olefin copolymer (COC), and the like.

Signal lines (or electrodes) TL for transmitting various signals (or voltages) to the active region AA are disposed in the bezel region NA. The signal lines TL extend from the bezel region NA to an interior of the active region AA, and transmit a corresponding signal to the active region AA. The signal lines TL may include a data line to which a data voltage is applied, a gate line to which a gate signal is applied, and a power line to which a source voltage is applied. The source voltage may include a high potential source voltage, a low potential source voltage, a reference voltage, and the like, generated by a power generating unit. However, the present disclosure is not limited thereto and the signal line TL may include any line extending from the bezel region NA to the interior of the active region AA and transmitting signals required for driving the elements within the active region AA.

The data line receives a data voltage through a data driving circuit. The gate line receives a gate signal through a gate driving circuit. A pixel driving unit IC including the data driving circuit and the gate driving circuit may be disposed on the bezel region NA. For example, the gate driving circuit may be disposed directly on the bezel region NA according to a scheme of a gate-driver in panel (GIP) circuit. The power line receives a source voltage generated by a power source generating unit.

A plurality of pixels are disposed in a matrix manner in the active region AA. The pixels may be divided by a data line, a gate line, and a source line. An OLED and TFTs for driving the OLED are disposed in each of the pixels. The TFTs may be formed in a TFT region defined in a portion of each pixel.

Referring to FIGS. 7 and 8, when the flexible display device is bent, stress is applied on the signal lines TL of the bezel region NA. When stress equal to or greater than breaking strength is applied to the signal lines TL of the bezel region NA due to bending, the signal lines TL may be cracked or disconnected. When the signal lines TL are cracked or disconnected, a transmission path of a corresponding signal is blocked to cause a defective screen driving.

The flexible display device according to the present disclosure features that two or more signal transmission paths to which the same signal is applied are secured by forming a bypass line receiving the same signal as that of the signal line TL in addition to the signal lines TL. Thus, in the flexible display device according to the present disclosure, even when any of signal transmission paths is blocked due to stress applied during bending, a corresponding signal may be supplied to the active region AA through a different signal transmission path.

Referring to part (a) of FIG. 7, a signal line TL and a first bypass line SR1 are provided on the substrate SUB. The signal line TL extends from the bezel region NA to the active region AA to supply a specific signal to the active region AA. The first bypass line SR1 is provided in the bezel region NA. The first bypass line SR1 is provided above or below the signal line TL with one or more insulating layers IN1 interposed therebetween. The first bypass line SR1 is connected to the signal line TL via a first bypass contact hole CH1 penetrating through an insulating layer IN1 disposed between the first bypass line SR1 and the signal line TL. The first bypass line SR1 is electrically connected to the signal line TL via the first bypass contact hole CH1 to receive the same signal as that of the signal line TL. The first bypass line SR1 and the signal line TL are connected via at least two first bypass contact holes CH1. Thus, the flexible display device according to the present disclosure may include a first signal transmission path PS1 transmitting a specific signal via only the signal line TL and a second signal transmission path PS2 transmitting a specific signal through the signal line TL and the first bypass line SR1 in a bypass manner.

When the flexible display device is bent, the signal line TL to which a first signal is applied may be cracked due to stress applied on the display device. The first signal transmission path PS1 to which the first signal is applied may be blocked due to the generated crack. Also, in this case, in the flexible display device according to the present disclosure, the first signal may be supplied to the active region AA through the second transmission path PS2. Although not shown, when the second signal transmission path PS2 is blocked due to stress applied during bending, the first signal may be supplied to the active region AA through the first signal transmission path PS1.

Referring to part (b) of FIG. 7, the flexible display device according to the present disclosure may further include at least one second bypass line SR2 provided in the bezel region NA. The second bypass line SR2 is provided above or below the first bypass line SR1 with one or more insulating layers IN2 interposed therebetween. The second bypass line SR2 is connected to the first bypass line SR1 via a second bypass contact hole CH2 penetrating through an insulating layer IN2 disposed between the second bypass line SR2 and the first bypass line SR1. The second bypass line SR2 is electrically connected to the first bypass line SR1 via the second bypass contact hole CH2 to receive the same signal as those of the first bypass line SR1 and the signal line TL. The second bypass line SR2 and the first bypass line SR1 are connected via at least two second bypass contact holes CH2. Thus, the flexible display device according to the present disclosure may include the first signal transmission path PS1 transmitting a specific signal via only the signal line TL, the second signal transmission path PS2 transmitting a specific signal via the signal line TL and the first bypass line SR1 in a bypass manner, and a third signal transmission path PS3 transmitting a specific signal via the signal line TL and the bypass lines SR1 and SR2 in a bypass manner.

The display device according to the present disclosure may include the signal line TL and the bypass lines, and the first bypass contact hole CH1 formed to connect the signal line TL and the first bypass line SR1 and the second bypass contact hole CH2 formed to connect the first bypass line SR1 and the second bypass line SR2 may be in plurality. When the plurality of bypass contact holes are provided, a large number of bypass signal transmission paths may be secured. For example, referring to FIG. 8, the signal line TL and the first bypass line SR1 to which the first signal is applied may be connected via four first bypass contact holes CH1. Even if crack occurs in portions of the signal line TL and the first bypass line SR1 so the first signal transmission path PS1 and a (2-1)th signal transmission path PS2_1 are blocked, the first signal may be transmitted to the active region AA via a (2-2)th signal transmission path PS2_2. The number of bypass contact holes may be appropriately selected in consideration of a defective process, and the like, that may occur when a bypass contact hole is formed.

As described above, since a plurality of signal transmission paths to which the same signal is applied are secured in the bezel region, defective driving that occurs as a signal transmission path is blocked by stress applied during bending may be minimized. Also, the signal line TL and the first and second bypass lines SR1 and SR2 are connected in parallel. Thus, the flexible display device according to the present disclosure may reduce line resistance.

At least one first and second bypass lines SR1 and SR2 to which the same signal as that of the signal line TL is applied may be disposed above and/or below the signal line TL to serve to distribute stress that may concentrate on the signal line in the case of bending. The flexible display device according to the present disclosure may have at least one bypass line SR1 to minimize occurrence of crack on the signal line TL.

Also, the first and second bypass lines SR1 and SR2 may be provided to be parallel to the signal line TL in one direction. In a case in which the signal line TL and the first and second bypass lines SR1 and SR2 extend to be parallel in one direction and overlap each other, there is no need to secure a separate space on the plane to further form the first and second bypass lines SR1 and SR2. In this case, a bypass signal transmission path may be secured without increasing a bezel region NA.

Figure 9:
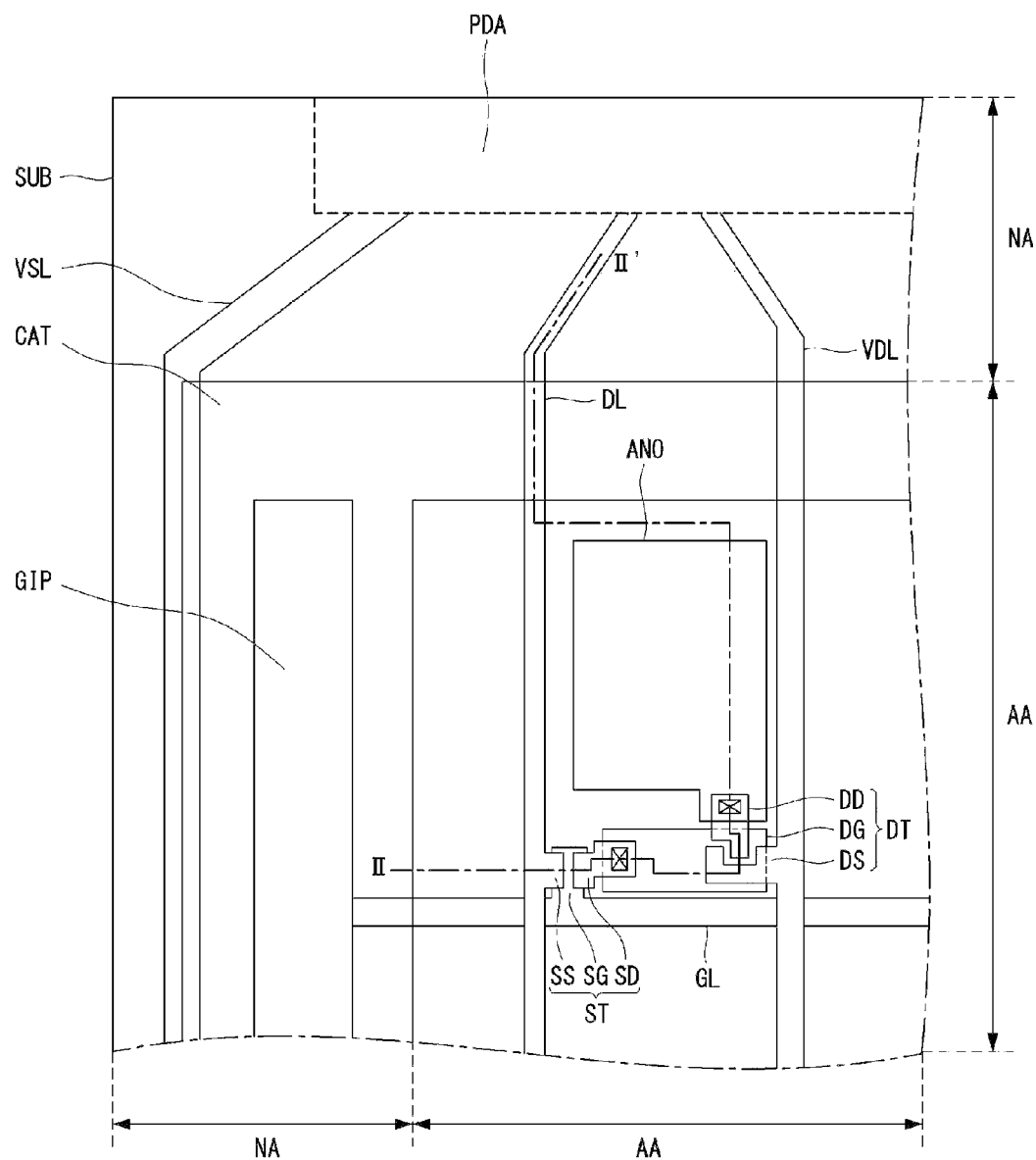
FIG. 9 is a plan view illustrating a schematic structure of a flexible display device according to an embodiment of the present disclosure.
Figure 10:
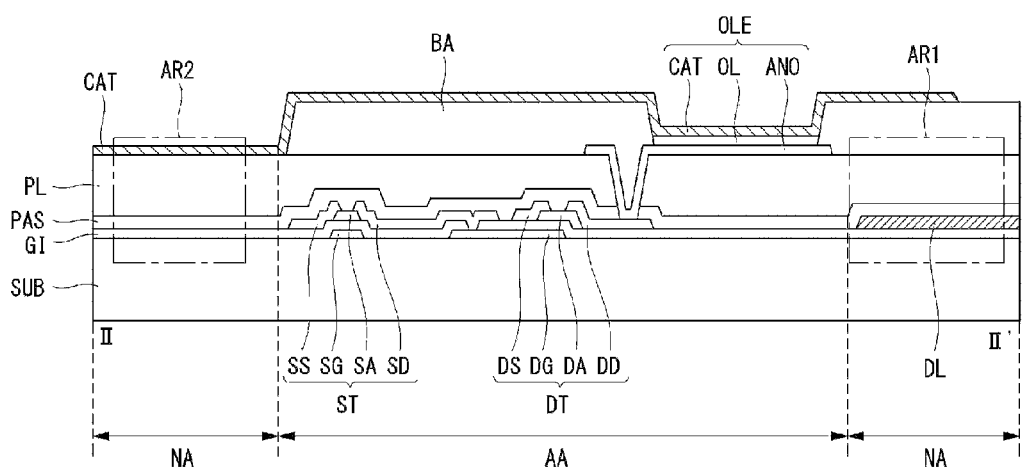
FIG. 10 is a cross-sectional view taken along line II-II' of FIG. 9.

Hereinafter, a specific embodiment of the flexible display device according to the present disclosure will be described with reference to FIGS. 9 through 12. FIG. 9 is a plan view illustrating a schematic structure of a flexible display device according to an embodiment of the present disclosure. FIG. 10 is a cross-sectional view taken along line II-II' of FIG. 9. FIG. 11 is an enlarged view of a region "AR1" of FIG. 10. FIG. 12 is an enlarged view of a region "AR2" of FIG. 10.

Referring to FIGS. 9 and 10, an active region AA and a bezel region NA are defined on a substrate SUB. A plurality of pixels arranged in a matrix form are defined on the active region AA. The pixels are divided by a gate line GL to which a gate signal is applied, data lines DL to which a data voltage is applied, and a high potential power line VDL to which a high potential source voltage is applied. The gate line GL may receive a gate signal from a gate driving circuit GIP directly formed on the bezel region NA. The data lines DL may be electrically connected to a data pad of a pad part PDA provided on one side of the bezel region NA and receive a data voltage. The high potential power line VDL may be electrically connected to a high potential power pad of the pad part PAD to receive a high potential source voltage.

An organic light emitting diode OLE and TFTs (ST and DT) for driving the organic light emitting diode OLE are disposed in each pixel. The organic light emitting diode OLE includes an anode electrode ANO, a cathode electrode CAT, and an organic emission layer OL interposed between the two electrodes ANO and CAT.

A switching TFT ST and a driving TFT DT are formed in each pixel. The switching TFT ST includes a switching gate electrode SG branched from the gate line GL, a switching channel layer SA, a switching source electrode SS branched from the data line DL formed on a gate insulating layer GI, and a switching drain electrode SD. Also, the driving TFT DT includes a driving gate electrode DG connected to the switching drain electrode SD of the switching TFT ST, a driving channel layer DA, a driving source electrode branched from a high potential power line VDL, and a driving drain electrode DD. The driving TFT DT serves to drive the organic light emitting diode OLE of a pixel selected by the switching TFT ST. The structures of the TFTs (ST and DT) are not limited thereto. The TFT (ST and DT) may include any structure as long as it is able to drive the flexible display device such as a top gate structure, a bottom gate structure, a double gate structure, and the like. A passivation layer PAS and a planarization layer PL are sequentially formed on the TFTs (ST and DT).

An anode electrode ANO is formed on the planarization layer PL. The anode electrode ANO is formed in each pixel. The anode electrode ANO is connected to a driving drain electrode DD of the driving TFT DT via a contact hole penetrating through the passivation layer PAS and the planarization layer PL. The anode electrode ANO may be spaced apart from an anode electrode ANO of an adjacent pixel so as not to be in contact.

A bank BA exposing the great part of the anode electrode ANO is formed on the anode electrode ANO. An organic emission layer OL is formed on the anode electrode ANO exposed by the bank BA pattern. A cathode electrode CAT is formed on the organic emission layer OL and the bank BA. The cathode electrode CAT is deposited on the entire surface. The cathode electrode CAT is electrically connected to a low potential power line VSL provided in the bezel region NA. The low potential power line VSL may be electrically connected to the low potential power pad of the pad part PDA to receive a low potential source voltage. In this manner, the organic light emitting diode OLE including the anode electrode ANO, the organic emission layer OL, and the cathode electrode CAT is formed.

Figure 11A:
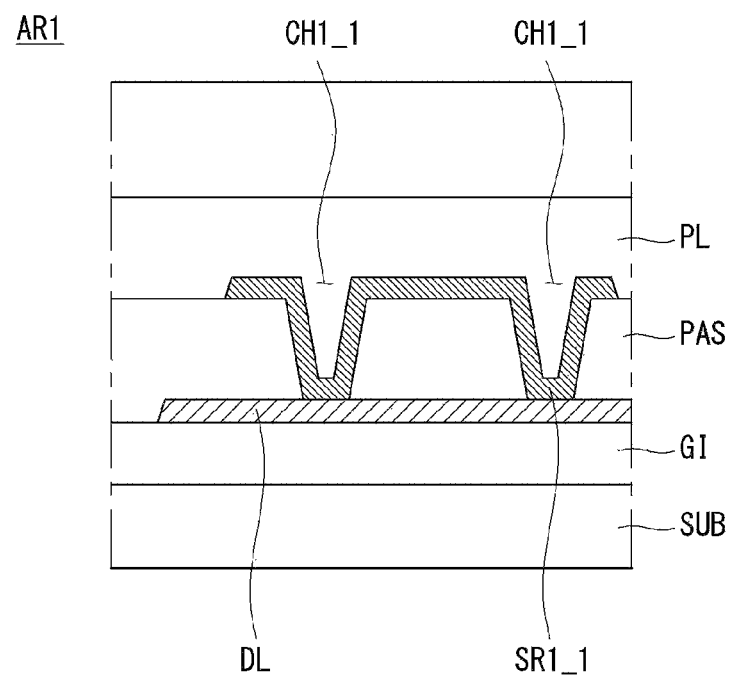
FIGS. 11A-11C are enlarged views of a region "AR1" of FIG. 10.

Referring to FIG. 11A, the flexible display device according to an embodiment of the present disclosure further includes a (1-1)th bypass line SR1_1 provided in the bezel region NA. The (1-1)th bypass line SR1_1 is disposed on the data line DL with the passivation layer PAS interposed therebetween. The (1-1)th bypass line SR1_1 is connected to the data line Dl via (1-1)th bypass contact holes CH1_1 penetrating through the passivation layer PAS. The same data voltage is applied to the (1-1)th bypass line SR1_1 and the data line DL connected thereto.

Figure 11B:
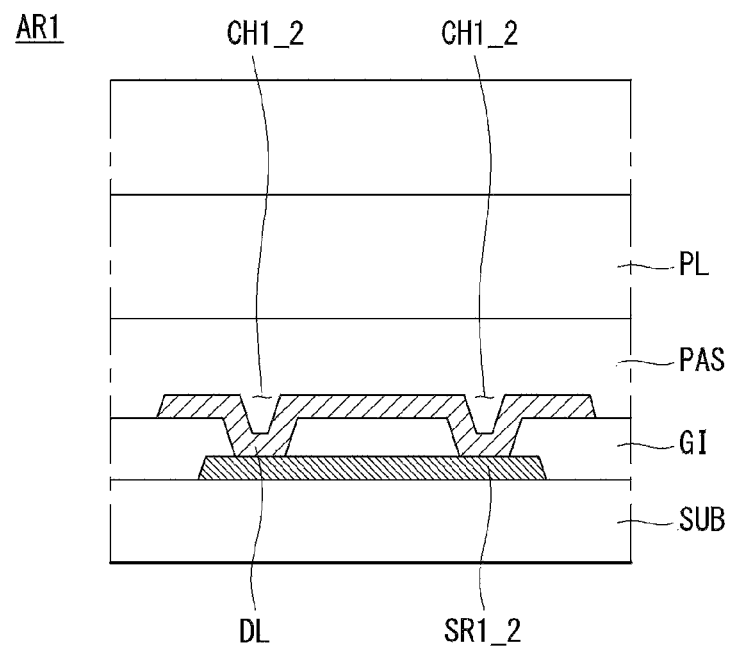

Referring to FIG. 11B, the flexible display device according to an embodiment of the present disclosure further includes a (1-2)th bypass line SR1_2 provided in the bezel region NA. The (1-2)th bypass line SR1_2 is disposed under the data line DL with the gate insulating layer GI interposed therebetween. The (1-2)th bypass line SR1_2 is connected to the data line DL via (1-2)th bypass contact holes CH1_2 penetrating through a gate insulating layer GI. The same data voltage is supplied to the (1-2)th bypass line SR1_2 and the data line DL connected thereto.

Figure 11C:
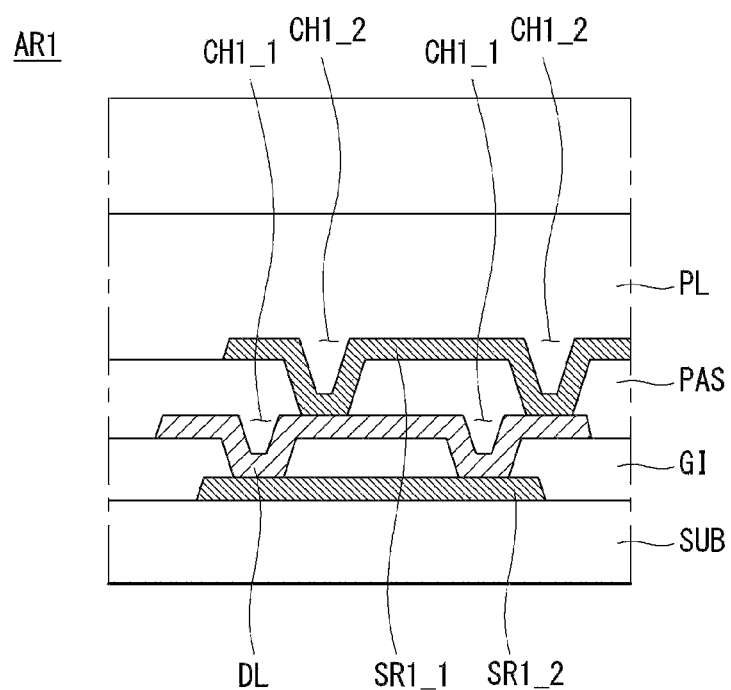

Referring to FIG. 11C, the flexible display device according to an embodiment of the present disclosure further includes a (1-1)th bypass line SR1_1 and a (1-2)th bypass line SR1_2 provided in the bezel region NA. The (1-1)th bypass line SR1_1 is disposed on the data line DL with a passivation layer PAS interposed therebetween. The (1-1)th bypass line SR1_1 is connected to the data line DL via (1-1)th bypass contact holes CH1_1 penetrating through a passivation layer PAS. The (1-2)th bypass line SR1_2 is disposed under the data line DL with a gate insulating layer GI interposed therebetween. The (1-2)th bypass line SR1_2 is connected to the data line DL via (1-2)th bypass contact holes CH1_2 penetrating through the gate insulating layer GI. The same data voltage is supplied to the first bypass lines SR1 and SR2 and the data line DL connected thereto.

Figure 12A:
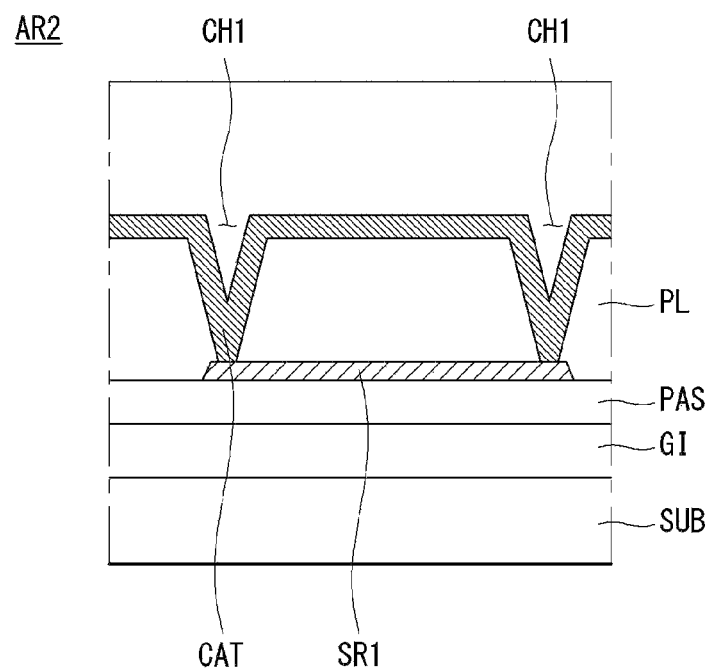
FIGS. 12A-12C are enlarged views of a region "AR2" of FIG. 10.

Referring to FIG. 12A, the flexible display device according to an embodiment of the present disclosure further includes a first bypass line SR1 provided in the bezel region NA. The first bypass line SR1 is disposed under a cathode electrode CAT with a planarization layer PL interposed therebetween. The first bypass line SR1 is connected to a cathode electrode CAT via first bypass contact holes CH1 penetrating through the planarization layer PL. A low potential source voltage is supplied to the first bypass line SR1 and the cathode electrode CAT connected thereto.

Figure 12B:
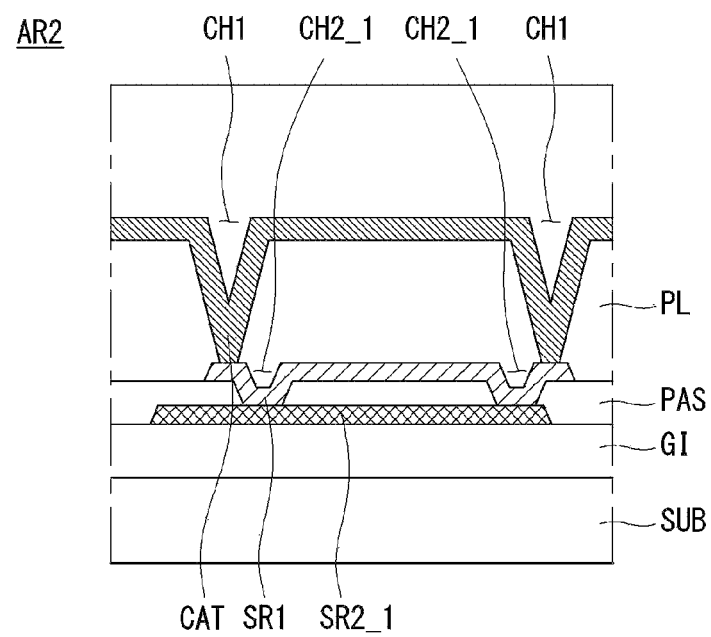

Referring to FIG. 12B, the flexible display device according to an embodiment of the present disclosure further includes a first bypass line SR1 and a (2-1)th bypass line SR2_1 provided in the bezel region NA. The first bypass line SR1 is disposed under a cathode electrode CAT with a planarization layer PL interposed therebetween. The first bypass line SR1 is connected to the cathode electrode CAT via first bypass contact holes CH1 penetrating through the planarization layer PL. The (2-1)th bypass line SR2_1 is disposed under the first bypass line SR1 with the passivation layer PAS interposed therebetween. The (2-1)th bypass line SR2_1 is connected to the first bypass line SR1 via (2-1)th bypass contact holes CH2_1 penetrating through the passivation layer PAS. A low potential source voltage is supplied to the first bypass line SR1 and the (2-1)th bypass line SR2_1 and the cathode electrode CAT electrically connected thereto.

Figure 12C:
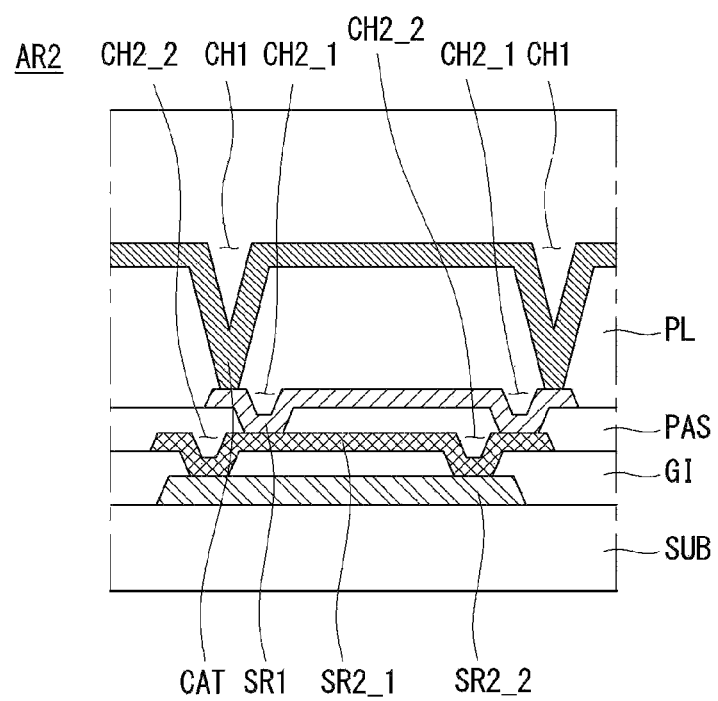

Referring to FIG. 12C, the flexible display device according to an embodiment of the present disclosure further includes a first bypass line SR1, a (2-1)th bypass line SR2_1 and a (2-2)th bypass line SR2_2 provided in the bezel region NA. The first bypass line SR1 is disposed under a cathode electrode CAT with a planarization layer PL interposed therebetween. The first bypass line SR1 is connected to the cathode electrode CAT via first bypass contact holes CH1 penetrating through the planarization layer PL. The (2-1)th bypass line SR2_1 is disposed under the first bypass line SR1 with the passivation layer PAS interposed therebetween. The (2-1)th bypass line SR2_1 is connected to the first bypass line SR1 via (2-1)th bypass contact holes CH2_1 penetrating through the passivation layer PAS. The (2-2)th bypass line SR2_2 is disposed under the (2-1)th bypass line SR2_1 with a gate insulating layer GI interposed therebetween. The (2-2)th bypass line SR2_2 is connected to the (2-1)th bypass line SR2_1 via (2-2)th bypass contact holes CH2_2 penetrating through the gate insulating layer GI. A low potential source voltage is supplied to the first bypass line SR1, the second bypass lines SR2_1 and SR2_2, and the cathode electrode CAT electrically connected thereto.

The first and second bypass lines SR1 and SR2 may be formed together when the elements, for example, the TFTs (ST and DT), and the organic light emitting diode OLE, provided in the active region are formed. For example, the first and second bypass lines SR1 and SR2 may be formed of the same material when the gate electrodes SG and DG, the source and drain electrodes SS, SD, DS, and DD, and the anode electrode ANO are formed. Although not shown, in a case in which a functional layer such as a light blocking layer for preventing ambient light from being incident, or the like, is further provided, the first and second bypass lines SR1 and SR2 may be formed of the same material as that of the functional layer when the function layer is formed. Thus, in an embodiment of the present disclosure, the flexible display device having a robust structure against stress applied during bending may be provided without an additional process to form a bypass line.

In describing the embodiments of the present disclosure, the case in which the signal lines and the bypass lines each are a single layer has been described as an example, but the present disclosure is not limited thereto. The signal line and/or the bypass lines may be formed as multiple layers in which different conductive materials are stacked, respectively.

It will be apparent to those skilled in the art that various modifications and variations can be made in the flexible display device of the present invention without departing from the spirit or scope of the invention. Thus, it is intended that the present invention cover the modifications and variations of this invention provided they come within the scope of the appended claims and their equivalents.

What is claimed is:

1. A flexible display device, comprising:
   a substrate having an active region in which an input image is implemented and a bezel region outside the active region;
   a signal line or an electrode extending from the bezel region and transmitting a signal or a voltage to the active region;
   a first bypass line provided above or below the signal line or the electrode with one or more first insulating layers interposed therebetween in the bezel region, wherein the first bypass line is connected to the signal line or the electrode via at least two first bypass contact holes penetrating through the one or more first insulating layers and receives the same signal or the same voltage as that of the signal line or the electrode; and at least one second bypass line provided above or below the first bypass line with one or more second insulating layers interposed therebetween in the bezel region, wherein the second bypass line is connected to the first bypass line via at least two second bypass contact holes penetrating through the one or more second insulating layers and receives the same signal or the same voltage as that of the signal line or the electrode and the first bypass line.

2. The flexible display device of claim 1, wherein at least a third first bypass contact hole is provided, the first bypass line being connected to the signal line or the electrode via the third first bypass contact hole such that the first bypass line provides at least first and second bypass transmission paths.

3. The flexible display device of claim 1, wherein at least a third second bypass contact hole is provided, and the second bypass line being connected to the first bypass line via the third second bypass contact hole such that the second bypass line provides at least third and fourth bypass transmission paths.

4. The flexible display device of claim 1, further comprising:

a data driving circuit supplying a data voltage to the active region;

a gate driving circuit supplying a gate signal to the active region; and a power generating unit generating a source voltage, wherein the signal line includes one or more of a data line receiving the data voltage;

a gate line receiving the gate signal; and a power line receiving the source voltage.

5. The flexible display device of claim 1, further comprising:

data lines, gate lines, and source voltage lines disposed to cross each other to divide pixels in the active region; and at least one thin film transistor (TFT) provided in each of the pixels, wherein the signal line comprises one or more of a data line to which a data voltage is applied;

a gate line to which a gate signal is applied; and a power line to which a source voltage is applied.

6. The flexible display device of claim 4, wherein the source voltage is any one of a high potential source voltage, a low potential source voltage, and a reference voltage.

7. The flexible display device of claim 5, wherein the source voltage is any one of a high potential source voltage, a low potential source voltage, and a reference voltage.

* * * * *